United States Patent [19]

Svedberg

[11] 4,282,555

[45] Aug. 4, 1981

[54] OVERVOLTAGE PROTECTION MEANS FOR PROTECTING LOW POWER SEMICONDUCTOR COMPONENTS

[75] Inventor: Per Svedberg, Vallingby, Sweden

[73] Assignee: ASEA Aktiebolag, Vasteras, Sweden

[21] Appl. No.: 65,774

[22] Filed: Aug. 13, 1979

[30] Foreign Application Priority Data

Aug. 17, 1978 [SE] Sweden ................................. 7808731

[51] Int. Cl.³ .......................... H02H 3/20; H02H 9/04
[52] U.S. Cl. ...................................... 361/56; 361/91; 361/111; 361/119
[58] Field of Search ........................ 361/54, 56, 90, 91, 361/111, 119; 307/252 R, 252 A, 252 Q, 318, 324, 284, 286, 287

[56] References Cited

U.S. PATENT DOCUMENTS

| 3,904,931 | 9/1975 | Leidich | 361/56 |
| 4,158,863 | 6/1979 | Naylor | 361/56 |

FOREIGN PATENT DOCUMENTS

| 2436033 | 2/1976 | Fed. Rep. of Germany | 361/56 |
| 960667 | 6/1964 | United Kingdom. | |
| 977913 | 12/1964 | United Kingdom | 307/318 |

Primary Examiner—Harry E. Moose, Jr.
Attorney, Agent, or Firm—Pollock, Vande Sande & Priddy

[57] ABSTRACT

An overvoltage protection device is employed to protect the low power semiconductor components of a circuit against overvoltages applied at the connection leads of the circuit. The device has at least two branches that are each connected between a common point and one of the connection leads of the circuit. Each branch includes a diode thyristor that is self-igniting in response to a particular overvoltage and an associated diode that is connected in opposed relation to the diode thyristor. The diode thyristors are aligned to conduct in the same direction with respect to the common point of connection. An additional branch may be connected between the common point and ground.

14 Claims, 9 Drawing Figures

OVERVOLTAGE PROTECTION MEANS FOR PROTECTING LOW POWER SEMICONDUCTOR COMPONENTS

BACKGROUND OF THE INVENTION

The present invention relates to a device for protecting a low power semiconductor circuit against overvoltages.

For many applications in the field of electronics, it is desirable to employ low power semiconductor circuits. Accordingly, there is a need for an efficient, inexpensive and reliable overvoltage protection device that will protect such circuits against overvoltages on their input leads. Typical semiconductor components for such low power circuits are: diodes, transistors, integrated circuits, and other components designed for maximum currents of one or a few amperes and maximum voltages of a hundred or a few hundred volts. Overvoltage protection devices may be used to protect the semiconductor circuitry that is employed, for example, in telephone stations and in telephone sets, or, in general, for semiconductor signal processing circuits.

It is known to use gas discharge tubes to provide overvoltage protection. However, a disadvantage of such tubes is that the tubes have a slow ignition time, thereby allowing an overvoltage to reach a relatively large amplitude before the gas discharge tube is activated. In addition, the ignition voltage cannot be precisely set in gas discharge tubes.

Zinc oxide varistors have also been used as overvoltage protection devices. However, such varistors have a relatively high leakage current during normal operation and also provide a poorly defined level of protection. In addition, the varistors show an appreciable degradation in response to repeated overvoltages.

It is also known to use zener diodes as overvoltage protection devices for semiconductor components. However, zener diodes must be provided with relatively large operational dimensions in order to provide a sufficient capacity for energy absorption. Moreover, both varistors and zener diodes show a relatively high capacitance, which has a harmful influence on the transmission of high frequency signals on the lines to which an overvoltage protection device is connected.

Accordingly, it is a primary object of the invention to provide a fast, efficient, inexpensive and reliable overvoltage protection device having relatively small operational dimensions and providing a well-defined and constant level of protection.

Another object of the invention is to provide such a device that has a low leakage current and a low capacitance.

These and other objects of this invention will become apparent from a review of the detailed specification which follows and a consideration of the accompanying drawings.

BRIEF SUMMARY OF THE INVENTION

In order to achieve the objects of the invention and to overcome the problems of the prior art, the overvoltage protection device, in accordance with the invention, includes at least two branches. Each branch is connected between a common point and one of the input connectors of a circuit that is to be protected. An additional branch may be provided to connect the common point to ground.

Each branch includes a diode thyristor that is adjusted to self-ignite at a particular preset voltage level. Each branch also includes a diode that is connected in opposed relation to its associated diode thyristor. The diode thyristors are aligned to conduct in the same direction with respect to the common point of connection of the branches.

Embodiments of the device may be provided wherein one or more branches are constructed in a semiconductor substrate. Alternatively, the thyristor diodes may be constructed in one semiconductor substrate and the associated diodes may be constructed in another semiconductor substrate.

BRIEF DESCRIPTION OF THE DRAWINGS

The invention will now be further described by reference to the drawings in which like reference characters refer to identical apparatus, and in which.

DETAILED DESCRIPTION OF PREFERRED EMBODIMENTS

Figure 1:
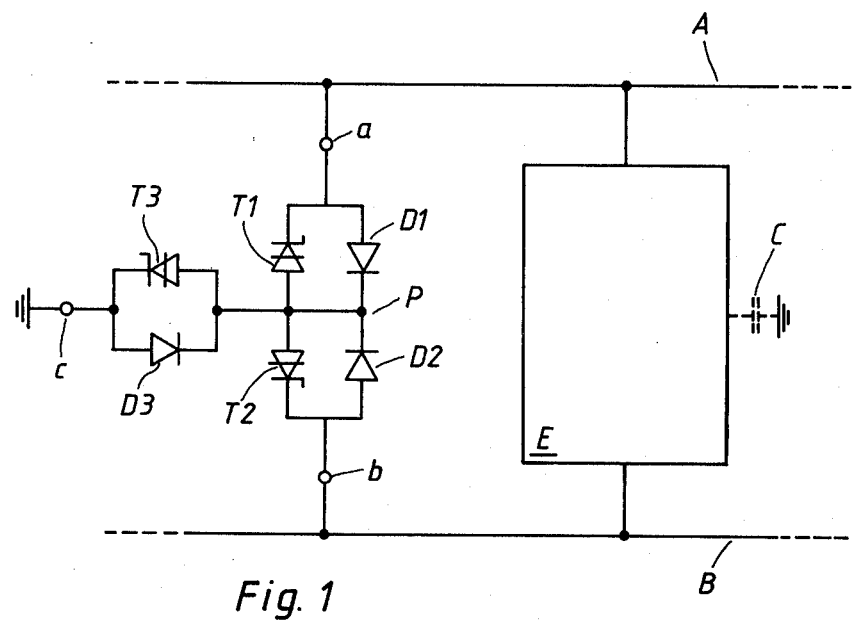
FIG. 1 shows a circuit diagram of a preferred embodiment of an overvoltage protection device in accordance with the invention.

The remaining portion of this specification will describe preferred embodiments of the invention when read in conjunction with the attached drawings, in which like reference characters identify identical apparatus.

FIG. 1 shows a symbolic representation of an electronic circuit E which comprises a plurality of semiconductor components. Such electronic circuits may be used in telephone sets or may be included as part of the equipment of a telephone exchange. The circuit is connected to the lines A and B (e.g., subscribers' lines) which are used to transmit both signals and supply voltages and on which overvoltages may arrive at the circuit E.

An impedance, for example a stray capacitance C, may exist between the circuit E and ground. Overvoltages may occur both between the lines A and B and between the lines and ground.

The overvoltage protection device, in accordance with the invention, may consist of three branches, each one having a diode thyristor (T1, T2, T3) connected in opposed relation with a diode (D1, D2, D3). The branches are connected between, on the one hand, a common point of connection P and the connection terminals a, b and c of the overvoltage protection device. These terminals are connected to the lines A and B and to ground. Each thyristor is constructed so as to be self-ignited when a breakover voltage ($U_T$, FIG. 4) exceeds the voltage prevailing during normal operation between the conductors A and B, or between one conductor and ground. The breakover voltage defines the level of protection of the protection device.

The protection device is intended for use in circuits where the connecting leads, when short-circuited, may deliver a direct current which is maximized to a certain value, for example, 100 mA. This is normally the case with telephone equipment. In accordance with the invention, each thyristor operates so that its holding current exceeds the above-mentioned maximum current value.

If, for example, a positive overvoltage relative to ground appears at the conductor A and has an amplitude that exceeds the breakover voltage of the thyristors, the thyristor T3 will ignite. In principle, this results in short-circuiting the conductor A to ground via the diode D1 and the thyristor T3 and therefore, the circuit E is protected. When the overvoltage disappears, the thyristor T3 resumes its non-conducting state as soon as the current that passes through it is below the holding current.

The corresponding function is obtained independently of the polarity of the incoming overvoltage, and irrespective of whether the overvoltage arises between a conductor and ground or between the conductors mutually. Thus, at least one of the thyristors T1-T3 will always ignite and protect the circuit E.

Because the voltage across the protection device is considerably lower than the level of protection when the protection device is operating, the overvoltage energy will be substantially dissipated in the line impedance and only a small amount of energy will be dissipated in the protection means. Therefore, the protection device can be given very small operational dimensions, which, among other things, has the advantage that the undesirable capacitance of the protection device is low. A further advantage of the device is that the breakover voltage of the thyristors can be very well-defined, as will be shown below, and therefore, the level of protection can be maintained precisely at a desired value. Also, it has been found possible to self-ignite a thyristor very rapidly, for example, within ten nanoseconds. Therefore, the protection device will be actuated before an overvoltage has time to reach a harmful level.

The overvoltage protection device, according to the invention, comprises a plurality of circuit branches that are connected at a common point. Thus, all of the semiconductor components included in the protection device will have one point in common. It should be understood that such a common connection scheme has considerable advantages. For example, as will be shown below, common connected semiconductor components may be integrated into one or into a few semiconductor substrates. Furthermore, a common metallic body may be provided for absorbing the loss energy that is developed in the protection means in response to an overvoltage. The dimensions of the energy-absorbing body may be minimized, since the overvoltage energy is never developed in more than two or at most three of the components of the protection device at one time. It should be appreciated that the above advantages are important from both a production and an economic standpoint.

Figure 2:
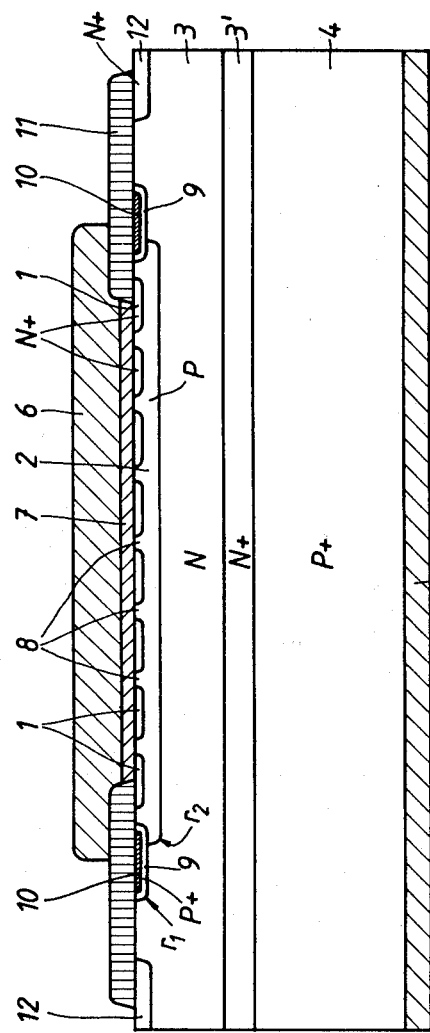
FIG. 2 shows a cross-sectional side elevation view of a thyristor in the overvoltage protection device of FIG. 1.

FIG. 2 shows a cross-section through a thyristor of the protection device. The thyristor has a first emitter layer 1, two base layers 2 and 3, and a second emitter layer 4. The emitter layers are doped more strongly than the base layers. To reduce the injection efficiency of the anode emitter junction, a highly doped N-conducting layer 3' is arranged in the base layer 3 nearest the emitter layer 4. The impurity concentration of the part of the layer 3' that lies nearest to the emitter layer 4 is suitably of the same order of magnitude as the impurity concentration of the part of the layer 4 that is closest to the layer 3'. The layer 1 is provided with a cathode contact 6 and the layer 4 has an anode contact 5. The contacts 5 and 6 are metal layers, for example, gold layers.

In order to achieve a low contact resistance between the contact 6 and the layer 1, a layer 7 of platinum silicide is arranged nearest the contact 6. It is also possible to arrange a platinum silicide layer below the contact 5 to reduce the contact resistance.

The layer 1 is provided with short-circuit holes 8 that are distributed over its surface. The base layer 2 contacts the cathode contact 6-7 through the holes 8. A thin P+- conducting layer 9 is applied at the edge of the base layer 2. The P+ layer runs around the whole edge of the base layer and thus, surrounds the emitter layer 1. The layer 9, together with the layer 3, forms a zener diode that develops a reverse voltage when a positive anode-cathode voltage is applied across the thyristor. The breakdown voltage (knee voltage) of the zener diode is determined primarily by the impurity concentration of the layer 3 and by the radius of curvature ($r_1$ in FIG. 2) at the edge of the layer 9. A particular value of breakdown voltage may be defined by a suitable selection of these two variables.

In order to make sure that breakdown occurs at the zener diode and not in the thyristor itself, the doping of the layer 9 is preferably stronger than the doping of the layer 2 and the radius of curvature ($r_1$) at the edge of the layer 9 is smaller than the radius of curvature ($r_2$) at the edge of the layer 2.

A layer 10 of platinum silicide provides a low-resistive ohmic connection in a lateral direction from the zener diode to the base layer 2 of the thyristor. The surface of the thyristor is covered by a silicon dioxide layer 11. An annular protective layer 12, which is strongly N-doped, runs around the edge of the thyristor and prevents surface leakage currents.

Figure 3:
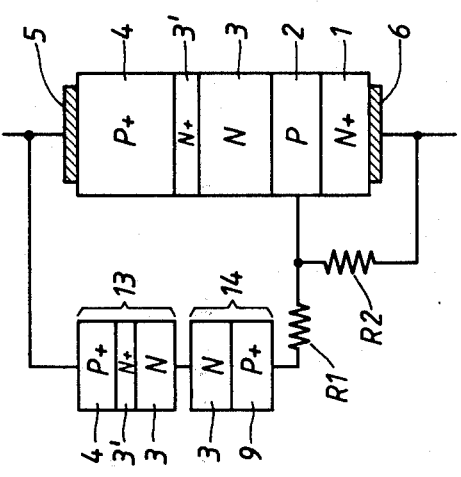
FIG. 3 shows a circuit diagram of the P and N regions of the thyristor of FIG. 2.

FIG. 3 shows schematically how the thyristor consists of layers 1-4 and contacts 5 and 6. A diode 13 which conducts in response to a positive anode voltage, consists of layers 4, 3' and 3 and lies in series with the zener diode 14 formed of layers 3 and 9. The resistance R1 in FIG. 2 consists of the lateral resistance of the layer 10 and of the layer 2 up to the edge of the emitter layer 1. A resistance R2 in FIG. 2 consists of the lateral resistance of the layer 2 from the edge of the layer 1 and up to the nearest short-circuit hole 8.

When the voltage across the thyristor is positive on the contact 5 and exceeds the knee voltage of the zener diode, current flows through the diodes 13 and 14 and resistances R1 and R2 to the cathode of the thyristor.

When the voltage drop across the resistance R2 becomes so great as to reach the on-state voltage drop (c. 0.5–1 V) of the junction between the layers 1 and 2, the emitter layer 1 starts injecting electrons at the edge located nearest to the zener diode, and the ignition thereafter spreads rapidly over the surface of the thyristor.

Figure 4:
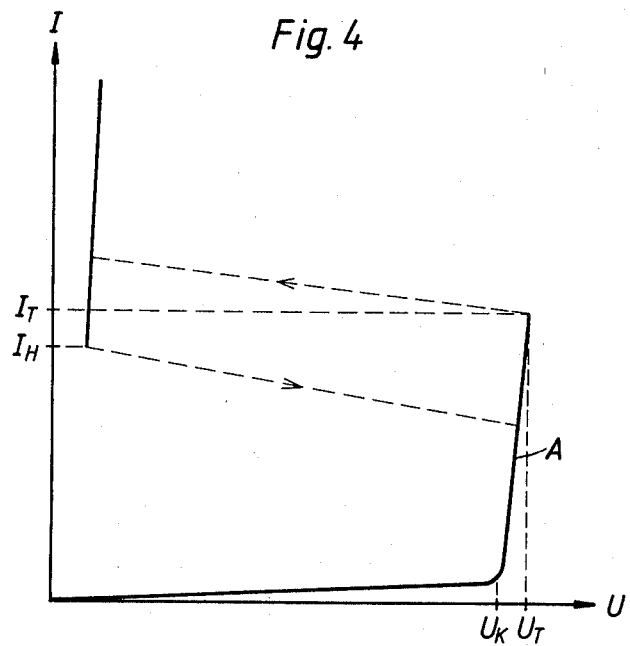
FIG. 4 shows a plot of the characteristic forward current and voltage of the thyristor of FIGS. 2 and 3.

FIG. 4 shows the current-voltage characteristics of the overvoltage protection device, in which $U_K$ designates the knee voltage of the zener diode part, $U_T$ the ignition voltage of the protection device, $I_T$ the ignition current of the protection device and $I_H$ the holding current of the device.

Figure 5B:
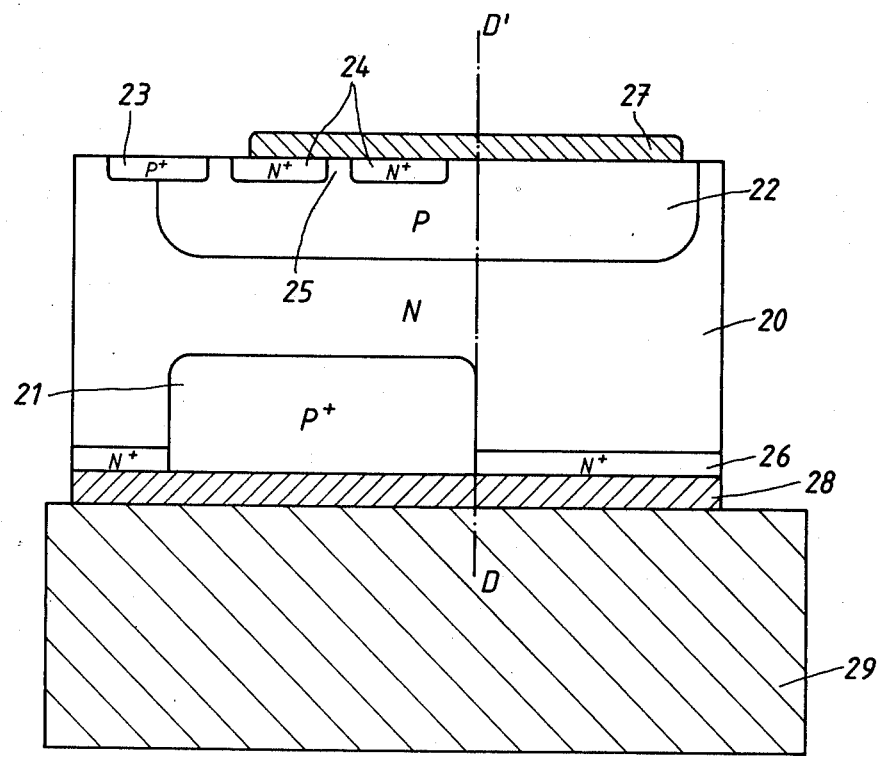
FIG. 5B shows a cross-sectional side elevation view of a device wherein the diode thyristor and diode of FIG. 5A are constructed in a semiconductor substrate.
Figure 5A:
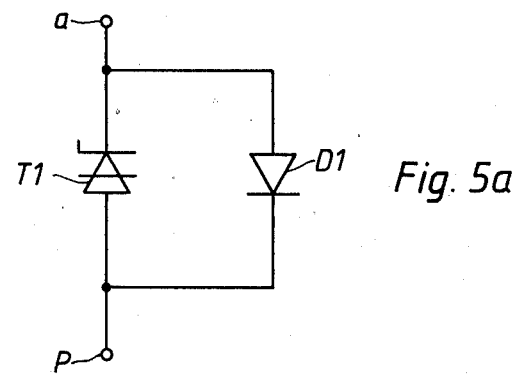
FIG. 5A shows a circuit diagram of the diode thyristor and diode of a branch of an overvoltage protection device in accordance with the invention.

FIG. 5 shows how the thyristor and the diode in one branch of the overvoltage protection device can be integrated. FIG. 5A shows a branch T1–D1 of the protection device and FIG. 5B shows how the two components of FIG. 5A can be formed on a common silicon substrate. The substrate has a central, slightly N-conducting layer 20. A diode portion lies on the right hand side of the line D–D' in the Figure and the thyristor portion is positioned on the left hand side of the line. The anode layer of the diode consists of a P-conducting layer 22 and the cathode layer is the N layer 20. The anode emitter of the thyristor is the P+-conducting layer 21, the N-base is the layer 20, the P-base is the layer 22 and the cathode emitter is the N+-conducting layer 24, which is provided with short-circuit holes 25.

The integrated zener diode consists of the layer 20 and the P+-conducting layer 23. The diode and thyristor have contacts 27 and 28 on opposite surfaces. Adjacent to the contact 28 is arranged an N+-conducting layer 26 that provides low contact resistance. The construction and function of the thyristor portion corresponds, in principle, to those described above in connection with FIGS. 2 to 4. A metallic body 29, for example, of tungsten or molybdenum, having a thickness of, for example, one or a few millimeters is arranged in pressure contact or soldered contact with the contact 28 of the silicon substrate. The body is intended to absorb and dispose of the energy that is developed in the diode and thyristor.

In the embodiment of FIG. 5B, the protection means comprises one silicon substrate for each branch. The silicon substrates may be arranged in separate capsules. Alternatively, they may be disposed in the same capsule, and the body 29 may be common to the substrate and may serve as the common connection point P.

Figure 6A:
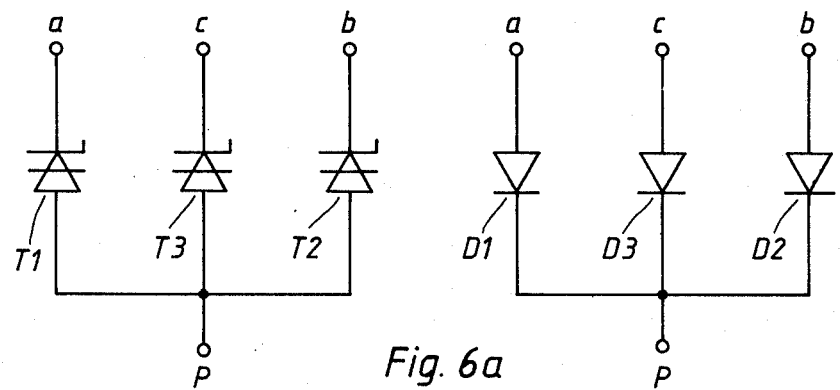
FIG. 6A shows a circuit diagram for the three diode thyristors and the three associated diodes of three branches of an overvoltage protection device.
Figure 6B:
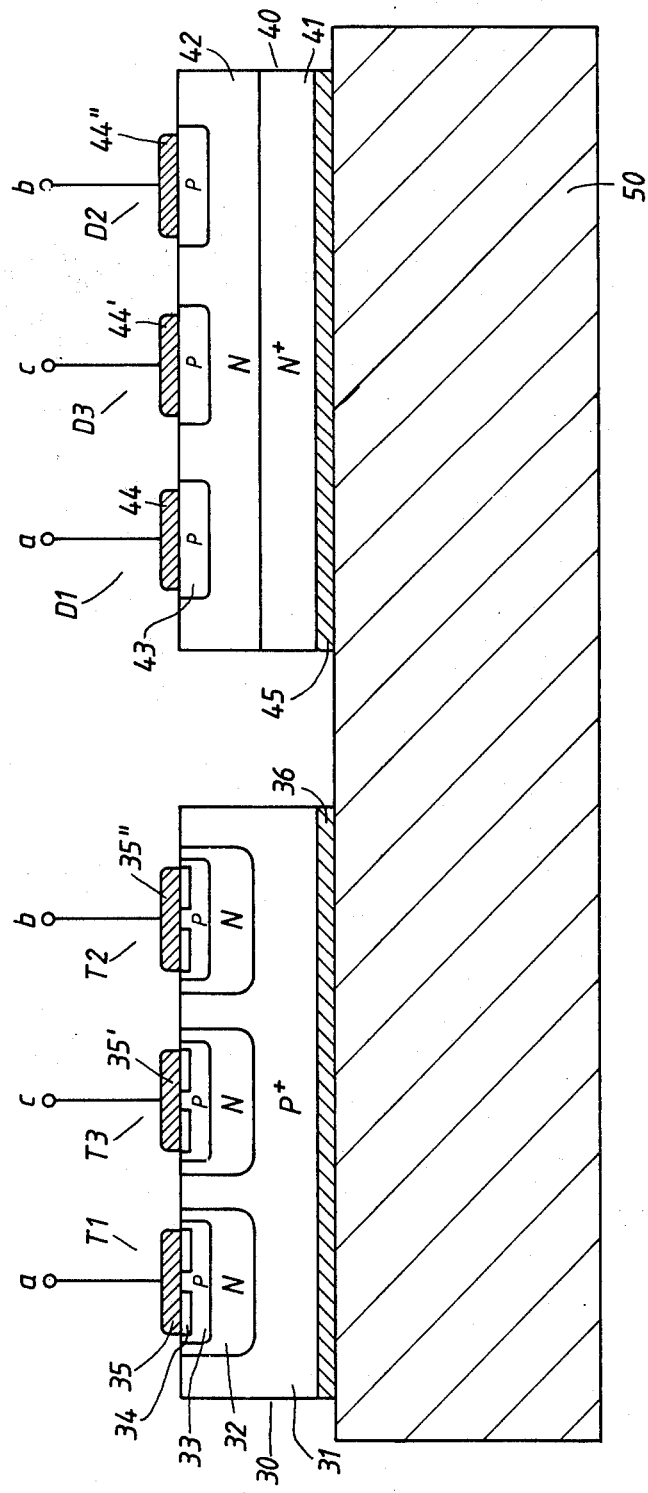
FIG. 6B shows a cross-sectional side elevational view of an overvoltage protection device wherein the diode thyristors of three branches are constructed in one semiconductor substrate and the associated diodes are constructed in another semiconductor substrate.

FIG. 6A shows schematically how the thyristors T1–T3 in a protection device with three branches may be integrated in a first silicon substrate and the diodes D1–D3 may be integrated in a second silicon substrate. FIG. 6B shows in more detail the construction of a protection device according to FIG. 6A. A first silicon substrate 30 contains the three thyristors T1–T3. The anode-emitter layer 31 is common to all of the thyristors. The thyristor T1 has an N-base layer 32, a P-base layer 33, an N-emitter layer 34 provided with short-circuit holes, and a cathode contact 35. For the sake of clarity the integrated zener diode (e.g., 20–23 in FIG.5B) is not shown in the Figure. The other two thyristors T2 and T3 have the same construction and are provided with cathode contacts 35'' and 35'. The P+-conducting layer 31 extends to the upper surface of the substrate 30 and separates the thyristors from each other, thereby reducing the leakage currents of two non-conducting thyristors when one thyristor carries current. A metallic contact 36 is arranged on the lower surface of the substrate 30.

The three diodes D1–D3 are comprised of a second silicon substrate 40. The N+-conducting layer 41, the N-conducting layer 42 and the metal contact 45 are common to all of the diodes. The diode D1 has a P-conducting anode layer 43 and the anode contact 44. The other two diodes D2 and D3 are built up in a corresponding manner and have anode contacts 44'' and 44', respectively. The layer 41 may be arranged to reach the upper surface of the substrate 40 to separate the diodes from each other, although such a structure is not required.

Substrates 30 and 40 are arranged on a common heat-absorbing and heat-diverting metal body 50, which corresponds to the body 29 in FIG. 5B and which constitutes the common connection point P. The substrates and the body are then disposed in a common capsule. Alternatively, the substrates 30 and 40 may be provided with separate metal bodies and may possibly be arranged in separate capsules.

Figure 7:
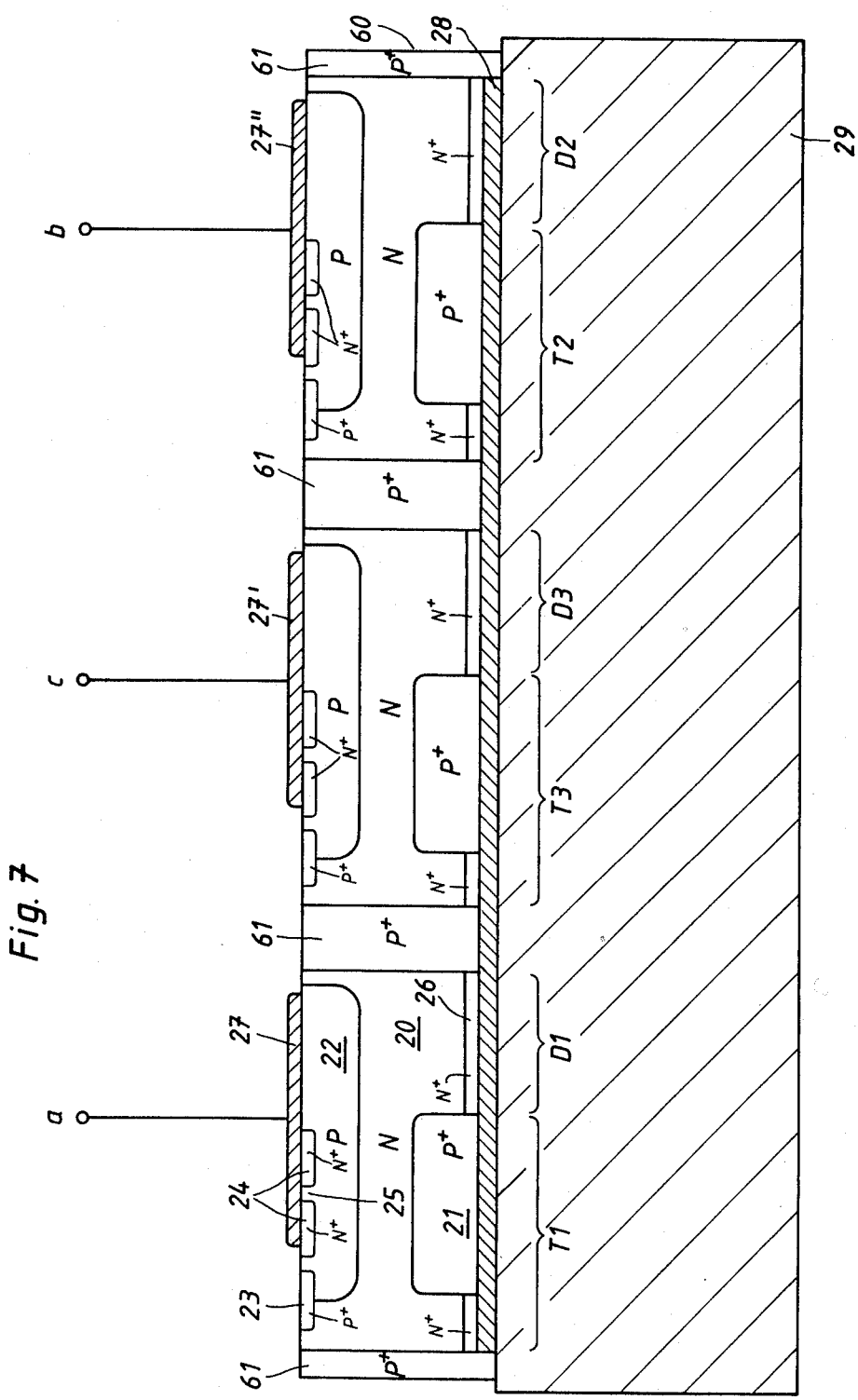
FIG. 7 shows a cross-sectional side elevation view of an overvoltage protection device wherein the three branches of the device are constructed in a single substrate.

FIG. 7 shows an embodiment in which the whole overvoltage protection device is constructed in one single silicon substrate 60. The substrate contains three units T1–D1, T2–D2 and T3–D3 arranged adjacent to one another. Each unit constitutes a branch of the protection device and is built up in the manner shown in FIG. 5B and described above. Unit T1–D1 is provided with the same reference designations as were used in FIG. 5B. Units T2–D2 and T3–D3 HAVE CONTACTS 27'' and 27', respectively, on the upper surface of the substrate 60, and a common contact 28 that is arranged on the lower surface of the substrate. A P+-conducting layer 61 surrounds each of the three units, thus separating the units.

The embodiment shown in FIG. 7 requires only one silicon substrate, only one heat-absorbing body 29, and one single capsule and is, therefore, extremely advantageous from the point of view of manufacture and installation.

Although the above description relates to an overvoltage protection device having three branches, the protection device may alternatively have only two branches or it may have more than three branches, without departing from the spirit of the invention.

In the embodiments described, the P-conducting layers and the N-conducting layers may be interchanged, resulting in a polarity reversal for the included component thyristors and diodes. Also it should be appreciated that the detailed description of the semiconductor components in the protection device is not intended to be limiting since the components may be arranged in a manner known to the art to provide an equivalent structure, without departing from the spirit of the invention.

The invention may be embodied in other specific forms without departing from the spirit or essential characteristics. The present embodiments are, therefore, to be considered in all respects as illustrative and not restrictive, the scope of the invention being indicated by the claims rather than by the foregoing description, and all changes which come within the meaning and range of the equivalents of the claims are therefore intended to be embraced therein.

What is claimed is:

1. Apparatus for protecting a low power semiconductor circuit against overvoltages at input connections of the circuit, comprising:

at least two connector branch means, one end of each connector branch means connected at a common point and the other end of each connector branch means connected to an associated one of said input connections, each connector branch means including a diode thyristor having means for self-ignition at a particular preset voltage level and a diode connected in opposed relation to the diode thyristor, the diode thyristors of each connector branch means being positioned to conduct in the same direction with respect to said common point; and wherein each of said diode thyristors includes means for defining a particular thyristor holding current that exceeds the value of maximum direct current that flows when said input connections are shorted.

2. Apparatus for protecting a low power semiconductor circuit against overvoltages at input connections of the circuit, comprising:

at least two connector branch means, one end of each connector branch means connected at a common point and the other end of each connector branch means connected to an associated one of said input connections, each connector branch means including a diode thyristor having means for self-ignition at a particular preset voltage level and a diode connected in opposed relation to the diode thyristor, the diode thyristors of each connector branch means being positioned to conduct in the same direction with respect to said common point; and including a ground branch means connected at one end to said common point and at the other end to ground, said ground branch means including a diode thyristor having means for self-ignition at a particular preset voltage level and a diode connected in opposed relation to the diode thyristor, the diode thyristor of the ground branch means being positioned to conduct in the same direction as the diode thyristors of each connector branch means with respect to said common point.

3. The apparatus of claim 2 wherein each of said diode thyristors includes means for defining a particular thyristor holding current that exceeds the value of maximum direct current that flows when said input connections are shorted.

4. The apparatus of claim 1 or 2 wherein each of said diode thyristors includes a zener diode integrated with the thyristor, the zener diode bridging the central junction of the thyristor and defining the ignition voltage of the thyristor.

5. The apparatus of claim 1 wherein the diode thyristor and the diode of at least one branch means is constructed in a common semiconductor substrate.

6. The apparatus of claim 1 wherein the diode thyristors are constructed in a common semiconductor substrate.

7. The apparatus of claim wherein the diodes are constructed in a common semiconductor substrate.

8. The apparatus of claim 1 wherein the diode thyristors and diodes are constructed in a single common semiconductor substrate.

9. The apparatus of claim 2 wherein the diode thyristor and the diode of at least one branch means is constructed in a common semiconductor substrate.

10. The apparatus of claim 2 wherein the diode thyristors are constructed in a common semiconductor substrate.

11. The apparatus of claim 2 wherein the diodes are constructed in a common semiconductor substrate.

12. The apparatus of claim 2 wherein the diode thyristors and diodes are constructed in a single common semiconductor substrate.

13. The apparatus of claim 5, 6, 7, 8, 9, 10, 11 or 12 wherein one side of said substrate includes a contact for connecting at said common point and the other side of said substrate includes a contact for providing an external electrical connection.

14. The apparatus of claim 13 wherein said one side of said substrate is disposed to contact a metal body and the metal body is said common point of connection.

* * * * *